United States Patent [19]

Sechi

[11] 4,376,287

[45] Mar. 8, 1983

[54] MICROWAVE POWER CIRCUIT WITH AN ACTIVE DEVICE MOUNTED ON A HEAT DISSIPATING SUBSTRATE

[75] Inventor: Franco N. Sechi, Lawrenceville, N.J.

[73] Assignee: RCA Corporation, New York, N.Y.

[21] Appl. No.: 201,827

[22] Filed: Oct. 29, 1980

[51] Int. Cl.³ .................. H03F 3/60; H01L 23/02; H01L 39/02

[52] U.S. Cl. ............................ 357/80; 29/571; 330/286; 330/289; 357/81

[58] Field of Search ............ 330/277, 286, 307, 289; 357/80, 81; 29/571

[56] References Cited

U.S. PATENT DOCUMENTS

| | | | |
|---|---|---|---|
| 3,748,544 | 7/1973 | Noren | 357/80 |
| 3,772,575 | 11/1973 | Hegarty et al. | |
| 3,908,185 | 9/1975 | Martin | 357/80 X |
| 3,986,196 | 10/1976 | Decker et al. | 357/81 X |
| 4,042,952 | 8/1977 | Kraybill | 357/68 |
| 4,135,168 | 1/1979 | Wade | 357/81 X |
| 4,156,211 | 5/1979 | Buswell et al. | 331/117 D |
| 4,168,507 | 9/1979 | Yester, Jr. | 357/51 |

Primary Examiner—James B. Mullins
Attorney, Agent, or Firm—J. S. Tripoli; R. L. Troike; R. E. Smiley

[57] ABSTRACT

A microwave power circuit includes a thermally conductive, electrically insulating substrate such as beryllium oxide which has a relatively rough surface, a layer of dielectric material such as glass on a portion of the rough surface which layer has a relatively smooth surface, a conductive material on the relatively smooth surface, and a heat dissipating amplifying device having at least two terminals, one of which is connected to the conductive material and one of which is thermally connected to the substrate in a manner to pass heat thereto.

8 Claims, 4 Drawing Figures

MICROWAVE POWER CIRCUIT WITH AN ACTIVE DEVICE MOUNTED ON A HEAT DISSIPATING SUBSTRATE

This invention relates to the construction of microwave power circuits and more particularly to power circuits including lumped elements mounted on a common substrate.

A power amplifying circuit for use with microwave frequencies includes not only an active device such as a gallium arsenide (GaAs) field effect transistor (FET) but also includes additional components to compensate for unwanted active device capacitance and inductance, while matching a circuit to a succeeding and following circuit.

In the prior art, the additional components are added in one of two ways. The active substrate such as GaAs may be made larger than necessary for the device and the additional components "printed" on the substrate. The problem with this approach is that the substrate material is usually expensive and only a few devices may be placed on one wafer increasing manufacturing costs apart from the substrate costs. In addition the substrate material is a poor thermal conductor necessitating a thin substrate layer attached to a metal heat sink. The combination of a thin substrate layer and a metal heat sink surface creates additional unwanted capacitance. An alternative approach is to package the active device conventionally and to add the additional components externally. However, there are at least three problems with this approach. First, the compensating components are lossy. Second, the large reactive components introduced by the package result in an undesirable narrow bandwidth. Third, it is difficult to accurately externally compensate the reactive components of the active device.

Materials useful as substrates are known which provide high thermal conductivity while desirably exhibiting low electrical conductivity. Power devices can be mounted on such substrates. In particular, it is known to mount transistors to one surface of a beryllium oxide (BeO) substrate. The substrate might include a conductive septum permitting the electrical interconnection between one or more transistor electrodes and a conducting ground plane on the opposite surface of the BeO. Transmission lines, employed as compensating elements of the distributed type, are printed on the BeO surface on which the transistor is mounted to connect the remaining transistor electrodes to remotely mounted components It is often advantageous to employ lumped elements, as opposed to distributed elements, as compensating components because their small size allows the construction of very small circuits. However, it is not possible to successfully print, with acceptable dimensional resolution, small size lumped elements on a BeO substrate because the substrate contains cavities exposed at its surface and, therefore, it is not possible to predict the electrical parameters of these lumped elements.

In accordance with a preferred embodiment of the invention, a microwave power amplifier circuit comprises in combination a substrate material of the type which is substantially an electrical insulator and provides a relatively high thermal conductivity and which has a relatively rough surface, a heat generating amplifying device having at least two electrodes one of which is thermally connected to the substrate so as to pass heat thereto, a layer of dielectric material on the rough surface forming a relatively smooth surface, a conductive material disposed on said smooth surface and coupled to another of the electrodes.

Figure 1:
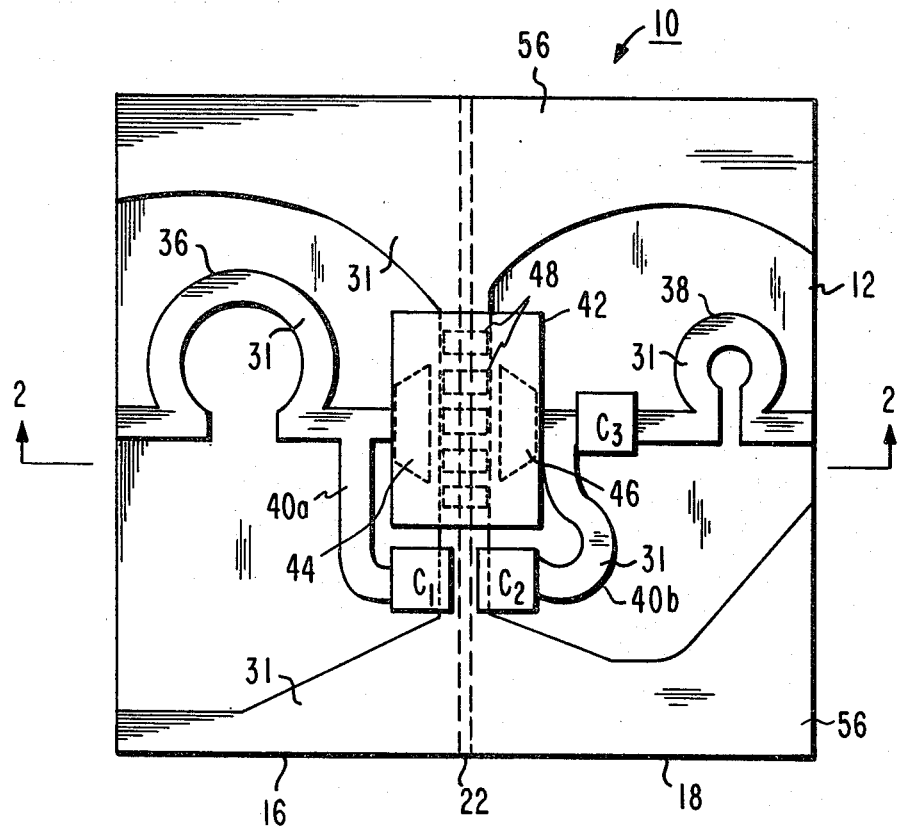
FIG. 1 is a plan view of a microwave power amplifier circuit construction in accordance with the invention.
Figure 2:
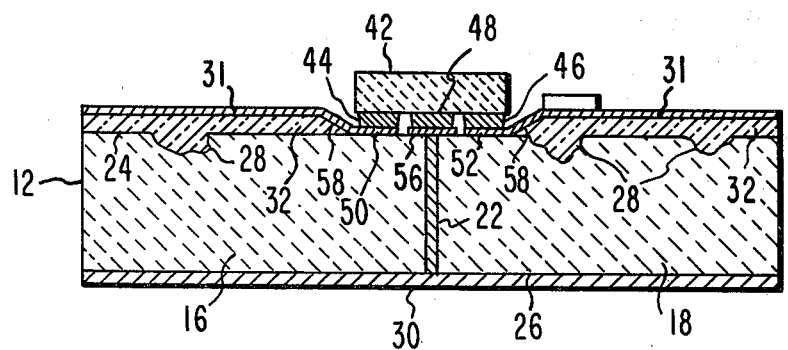
FIG. 2 is a cross-section along lines 2—2 of the amplifier of FIG. 1.

Referring now to FIGS. 1 and 2, a field-effect transistor (FET) power amplifier circuit 10 is illustrated. All components are attached to a beryllium oxide (BeO) substrate 12 comprising sections 16 and 18 of BeO separated by an electrically conductive septum 22. The septum, which is typically copper, extends from an upper surface 24 to a lower surface 26 of BeO substrate 12 (see FIG. 2). BeO is particularly desirable as a substrate because it has the following desirable properties: high electrical resistivity, high thermal conductivity, low loss at microwave frequencies, coefficient of thermal expansion matching that of an active device to be described hereinafter, mechanical strength, machineability and reasonable cost.

At the present time, BeO is the only material meeting all of these criteria. Diamond meets all criteria except machineability and cost. Unlike diamond, BeO has one undesirable characteristic: it has voids or cavities 28 in its surfaces causing those surfaces to be rough. This is true even after the surfaces have been machined due to the rather large grain size of the BeO. The conductive septums in the BeO substrate are usually made of copper. The construction is described in detail in "Improved Circuit-Device Interface for Microwave Bipolar Power Transistors" by E. F. Belohoubek, A. Presser and H. V. Velori, IEEE Journal of Solid-State Circuits, Vol. SC-11, No. 2, April 1976 pp. 256-263.

A conductive ground plane 30 on surface 26 of BeO substrate 12 typically comprises successive layers of copper, gold and platinum. The layers are deposited on surface 26 of BeO substrate 12 providing electrical conductivity to septum 22.

It is desired to deposit lumped passive elements on surface 24 of substrate 12. As previously mentioned, a BeO material surface, even when polished, contains a considerable number of voids or cavities which makes it impossible to print, with acceptable dimensional resolution small-size lumped elements.

Therefore, in accordance with the invention, a layer 32 of non-electrically conductive (dielectric) material is added to surface 24 of BeO substrate 12 providing a relatively smooth surface. The dielectric layer 32, which is typically a glass or a polymer dielectric layer, need not be on all of surface 24, but must be at least at those locations at which lumped elements are to be deposited. It will be understood that FIGS. 1 and 2 are not drawn to scale. The dielectric layer 32 although typically only a few microns in thickness relative to a BeO substrate of perhaps 25 mils, is shown much thicker for clarity.

A dielectric layer of glazing material should meet the following requirements: low loss at operating frequencies, thermal expansion closely matched to that of BeO, glazing firing temperature and ambient atmosphere during the firing compatible with the existing substrate metallization, particularly septum 22, fired glaze being smooth and its edges sufficiently tapered to enable conductors (to be hereinafter described) to extend unimpeded off of the glazing material, glaze compatible with subsequent processing of the circuit.

A material that is particularly well suited for glazing is Dupont 8190 glazing. This material is glass with a dielectric constant of 7 and expansion coefficient closely matching that of BeO. An alternative to glass is a dielectric of the polymer type, such as polyimide. Polyimide material has been used as a substrate, insulator and incapsulant throughout the semiconductor industry. Although its coefficient of expansion is 100 times greater than glass and, therefore, BeO, its plasticity and lower temperature cure (300° C.) may compensate for the coefficient of expansion difference. The layer 32 of dielectric material is applied to BeO substrate 12 in a manner suitable with the particular dielectric material using well-known techniques.

A conductive patterned layer 31 of interest is formed on top of the dielectric layer 32 as follows. Typically, this is done by simply applying a conductive layer typically consisting of cermet-copper-palladium-gold material on the entire surface of dielectric layer 32 including those areas of BeO substrate surface 24 which are not covered with dielectric material. Undesired areas of conductive material are then etched away using known techniques to thus create a pattern of conductors and passive components as illustrated particularly in FIG. 1. The patterned layer 31 includes a ground connection plate 56 which is electrically connected to septum 22 and thereby to ground plane 30. In FIG. 1, inductors 36 and 38 are illustrated as examples of passive components. In point of facts at the microwave frequencies of interest, all conductors are inductive to a certain extent. Thus, conductive portions 40a and 40b are in fact inductors as will be described further hereinafter. Because of the presence of the dielectric layer the electrical values of passive components can be accurately predicted.

After the conductive layer 31 is applied to the dielectric layer 32, and the circuit pattern etched therein, discrete components are applied. In particular an FET chip or pellet 42, having a gate pad 44, a drain pad 46 and a plurality of source pads 48, all illustrated in phantom in FIG. 1, is adapted for mounting to the BeO substrate. The gate pad 44 and drain pad 46 are thermally compression bonded to the conductive pattern portions 50 and 52, respectively of layer 31, as illustrated in FIG. 2. Source pads 48 are also thermally compression bonded to the ground plane 56 (FIG. 1). A method of making a suitable FET device is described in U.S. Pat. No. 3,993,515 issued Nov. 23, 1976 to W. F. Reichert. Separate thin film capacitors are also fabricated on the dielectric surface as best illustrated in FIG. 1 by little boxes with the letters $C_1$, $C_2$ and, $C_3$. These capacitors provide RF shorts at various places in the circuits of FIGS. 3 and 4 to be hereinafter discussed, while blocking d.c. bias signals (not shown).

As illustrated in FIG. 2, there is no dielectric material over septum 22. Source pads 48 are connected directly to ground plate 56 and because there is no dielectric material 32 over septum 22, ground plate 56 is directly connected to septum 22. Thus, there is a direct electrical connection between sources 48 and ground plane 30. Further, since the BeO material is thermally conductive, heat is conducted away from transistor pellet 42 via pads 44, 46 and 48 through the BeO substrate 12 to the ground plane 30 which may be mounted on a suitable heat sink, not shown.

As best illustrated in FIG. 2, the condutive layer 31 extends off of dielectric layer 32 in the vicinity of gate pad 44 and drain pad 46 (FIG. 2). Therefore pads 44, 46 and 48, which all have surfaces in the same plane, are bonded to conductors having surfaces in the same plane. It is therefore important that the edge of the dielectric layer 32 smoothly tapers from the nominal value to zero value as illustrated, for example, at point 58 (FIG. 2) so that there is no sharp discontinuity interrupting the continuity of the conductive layer 31.

Figure 3:
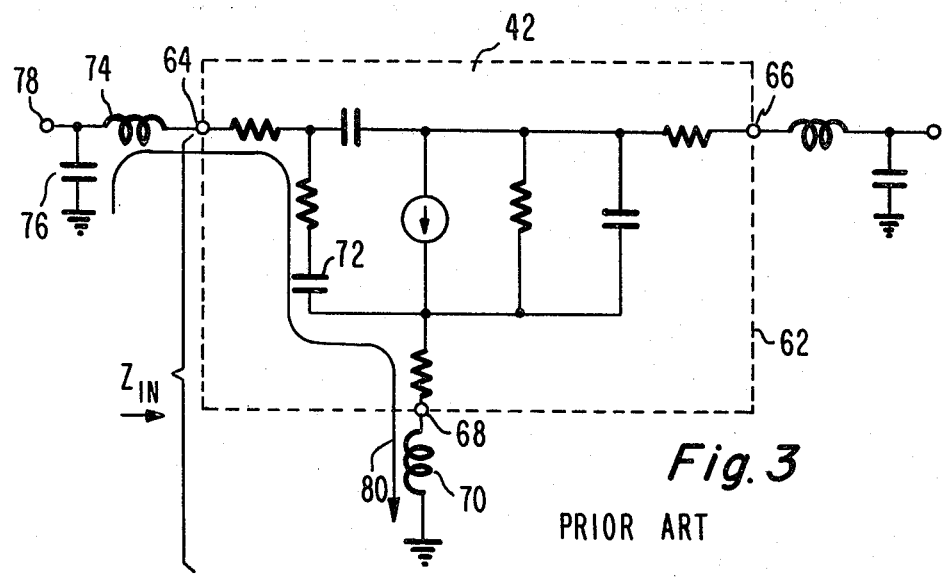
FIG. 3 is a prior art equivalent circuit schematic of a microwave power amplifier.

FIG. 3, to which attention is now directed, illustrates an equivalent circuit of an FET power device mounted on a conventional carrier in accordance with the prior art. In particular, the FET pellet 42 is illustrated within dashed lines 62. In FIG. 3, terminal 64 represents the FET pellet gate pad 44 (FIG. 2); terminal 66 represents the FET pellet drain pad 46 (FIG. 2); terminal 68 represents the electrical interconnection of the plurality of source pads 48. An inductor 70 connected between terminal 68 and circuit ground corresponds to the inductance of the physical conducting structure connecting the source pad of FET pellet 42 to electrical ground. An exemplary value for inductor 70 is 0.05 nanohenries (nH). An input tuning circuit connected to FET pellet 42 comprises an inductor 74 and a capacitor 76 series connected between gate terminal 64 and circuit ground. The inductor 74 and capacitor 76 represent matching components between the FET and a drive circuit (not shown) connected to terminal 78 of the FET circuit. Due to the relatively high capacitance, in the order of a few picofarads, of input capacitor 76, a highly reactive input current flows substantially as illustrated by arrow 80 through inductor 70. A typical input impedance $Z_{in}$ for the circuit of FIG. 3, is 2.3 ohms and a typical inductance value of inductor 74 is 0.5 nH representing the inductance between the FET pellet 42 and the edge of a carrier to which the pellet is connected. The resultant Q of the circuit of FIG. 3, as viewed from terminal 78 to ground is typically in excess of 50 which severely limits the bandwidth of the circuit.

Figure 4:
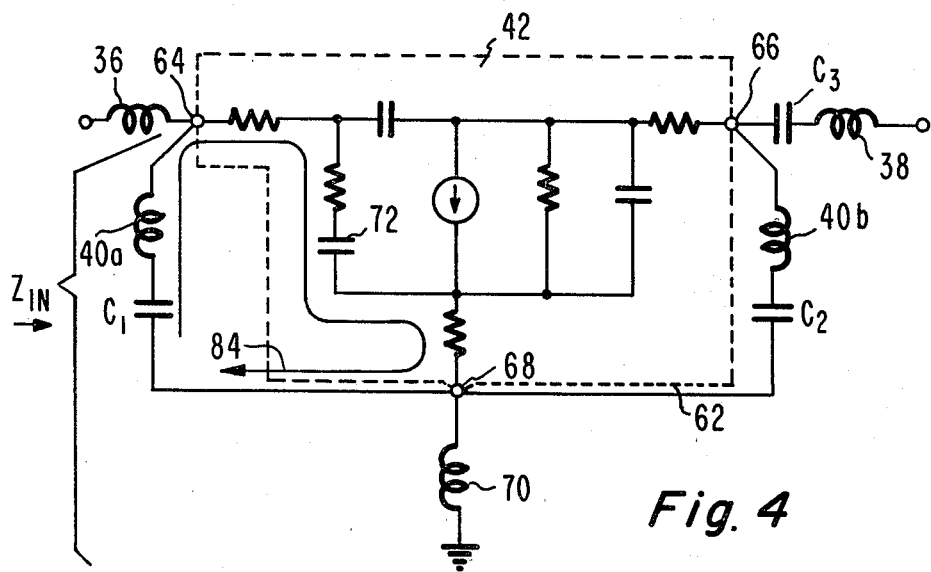
FIG. 4 is an equivalent circuit schematic of the microwave power amplifier circuit of FIGS. 1 and 2 in accordance with the invention.

By way of contrast, FIG. 4 is an equivalent circuit of an FET power amplifier with an FET pellet 42 mounted as in FIG. 1 and FIG. 2. The source terminal 68 is connected to inductor 70 which is equivalent to copper septum 22 (FIG. 2). Because the source pads 48 (FIG. 2) are directly accessible to be connected to tuning elements, an inductor 40a is connected directly between source terminal 68 and gate terminal 64 in the equivalent circuit of FIG. 4 bypassing source inductance 70. In the circuit of FIG. 4, the input impedance is typically about 12 ohms.

The resulting input Q of the FIG. 4 circuit is an acceptably low value of 0.3. Thus, due to the type of construction as illustrated in FIGS. 1 and 2, the input tuning inductor 40a bypasses source inductor 70 so that the input Q is low and the circuit bandwidth is high compared to that of conventional circuits such as FIG. 3. Further, unlike the current indicated by arrow 80 in FIG. 3, the current indicated by arrow 84 in FIG. 4 does not flow through the source inductor 70, FIG. 4. Therefore, as shown to those skilled in the art, the circuit of FIG. 4 realizes a higher power gain and a wider operating range of frequencies than does the circuit of FIG. 3.

What is claimed is:

1. A microwave power amplifier circuit comprising in combination:
   a substrate of the type which is substantially electrically insulative and provides a relatively high thermal conductivity and which has an undesirably relatively rough surface;
   a dielectric layer of material directly in contact with said relatively rough surface forming a relatively smooth surface;
   a conductive material disposed in a predetermined pattern on said dielectric layer; and
   a heat generating amplifying device having at least two electrodes, one of which is connected to said conductive material and another of which is thermally connected to said substrate to pass heat thereto.

2. The combination as set forth in claim 1, wherein said conductive material comprises at least one passive electronic element.

3. The combination as set forth in claim 1, wherein said substrate is Beryllium Oxide.

4. The combination as set forth in claim 1, wherein said layer is a glazing layer.

5. The combination as set forth in claim 1, wherein said heat generating amplifying device is a field effect transistor pellet.

6. The combination as set forth in claim 1 or 5, wherein said substrate includes an electrically conductive member extending therethrough between said rough surface thereof and an opposite surface and wherein said another electrode is electrically connected to said electrically conductive member.

7. The combination as set forth in claim 6, wherein said dielectric layer is not applied to said electrically conductive member.

8. A method of constructing a microwave power circuit which includes a heat generating amplifying device having at least two electrodes, comprising the steps of:
   a. providing an electrically insulating, thermally conductive substrate having a relatively rough surface;
   b. applying a layer of electrically insulating material directly on less than all of said rough surface, which layer forms a relatively smooth surface;
   c. applying a conductive layer over said electrically insulating layer;
   d. removing portions of said conductive layer to thereby leave a conductive pattern, said conductive pattern including at least a passive electronic component; and
   e. connecting one of said electrodes to said conductive layer and thermally connecting another of said electrodes to said substrate where said electrically insulating layer is not present.

* * * * *